(12) United States Patent
Chen

(10) Patent No.: US 8,405,442 B2
(45) Date of Patent: Mar. 26, 2013

(54) LEVEL SHIFTERS AND INTEGRATED CIRCUITS THEREOF

(75) Inventor: Bo-Ting Chen, Fengyuan (TW)

(73) Assignee: Taiwan Semiconductor Manufacturing Company, Ltd. (TW)

(*) Notice: Subject to any disclaimer, the term of this patent is extended or adjusted under 35 U.S.C. 154(b) by 121 days.

(21) Appl. No.: 12/872,079

(22) Filed: Aug. 31, 2010

(65) Prior Publication Data

US 2011/0095805 A1 Apr. 28, 2011

Related U.S. Application Data

(60) Provisional application No. 61/254,436, filed on Oct. 23, 2009.

(51) Int. Cl.
 *H03L 5/00* (2006.01)
(52) U.S. Cl. .......................................... 327/333
(58) Field of Classification Search .................. None
 See application file for complete search history.

(56) References Cited

U.S. PATENT DOCUMENTS

| 6,011,421 A * | 1/2000 | Jung ......................... 327/333 |
| 7,843,222 B1 * | 11/2010 | Shiah et al. ................. 326/81 |
| 2001/0020840 A1 * | 9/2001 | Kojima ....................... 323/282 |

FOREIGN PATENT DOCUMENTS

| KR | 10-2005-0079803 | 8/2005 |
| TW | 200539575 | 12/2005 |

OTHER PUBLICATIONS

OA dated Feb. 22, 2012 from corresponding application No. CN 201010523487.3.

* cited by examiner

*Primary Examiner* — Lincoln Donovan
*Assistant Examiner* — Khareem E Almo
(74) *Attorney, Agent, or Firm* — Lowe Hauptman Ham & Berner, LLP

(57) ABSTRACT

An integrated circuit includes a level shifter configured to receive a first voltage signal that swings between a first voltage level and a second voltage level, outputting a second voltage signal that swings between the first voltage level and a third voltage level. The third voltage level is higher than the second voltage level. An inverter is coupled with the level shifter. The inverter can receive the second voltage, outputting a third voltage signal that swings between the third voltage level and a fourth voltage level. The fourth voltage level is lower than the third voltage level and higher than the first voltage level.

19 Claims, 4 Drawing Sheets

LEVEL SHIFTERS AND INTEGRATED CIRCUITS THEREOF

CROSS-REFERENCE TO RELATED APPLICATIONS

The present application claims priority of U.S. Provisional Patent Application Ser. No. 61/254,436, filed on Oct. 23, 2009, which is incorporated herein by reference in its entirety.

TECHNICAL FIELD

The present disclosure relates generally to the field of semiconductor circuits, and more particularly, to level shifters and integrated circuits thereof.

BACKGROUND

As the semiconductor technology develops, an integrated circuit often contains some devices operating at a high voltage level, and other devices operating at a low voltage level. The low voltage devices may not tolerate a high voltage signal. Device failures happen frequently, when the low voltage devices operate with the high voltage signal. In order to protect the low voltage devices from the high voltage signals, the integrated circuit often includes an input/output (I/O) circuit as an interface between the low voltage devices and the high voltage devices. The I/O circuit allows the low voltage devices communicating with the high voltage devices, while protecting the low voltage devices from interfered by the high voltage signals.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
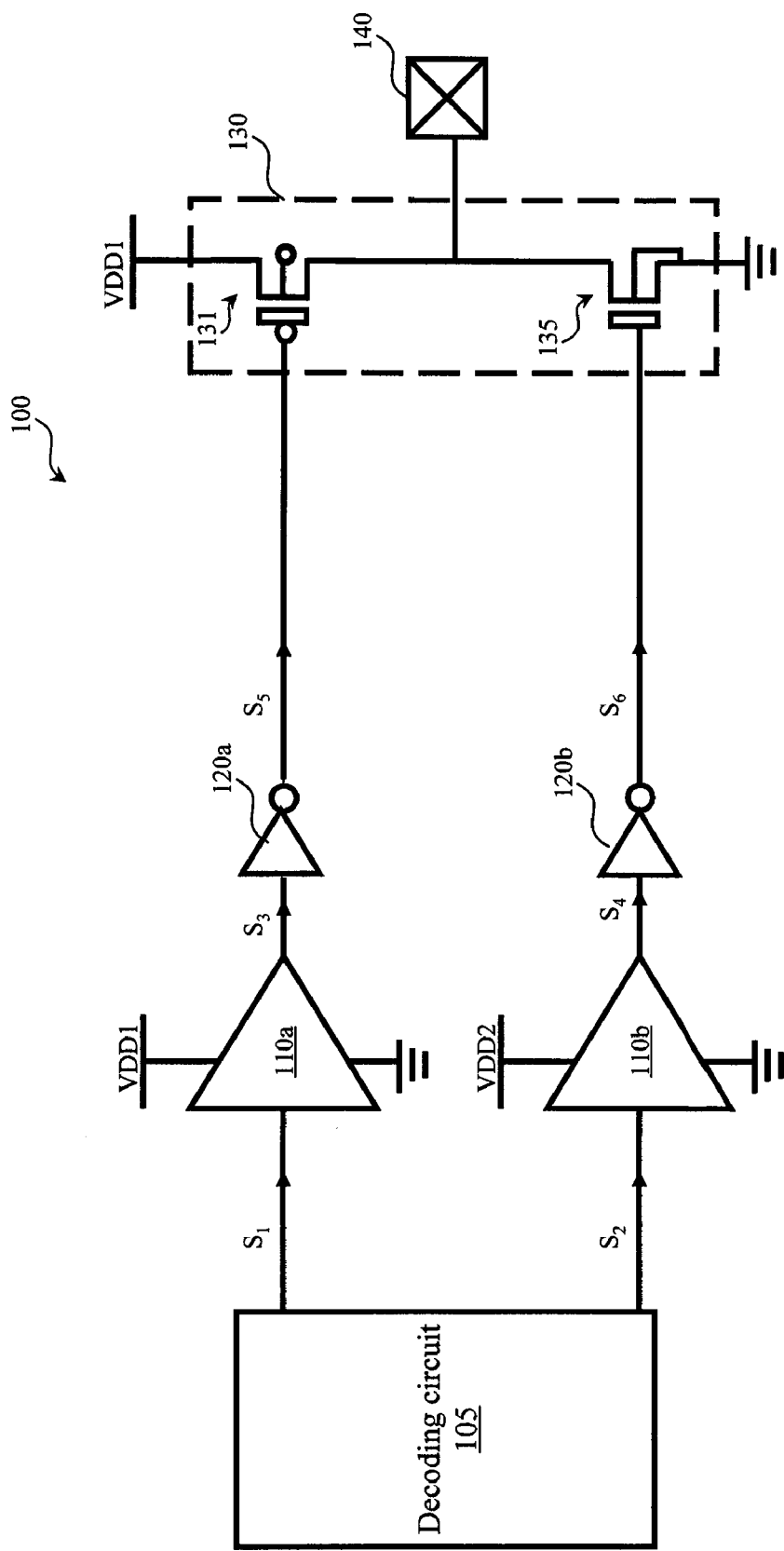
FIG. 1 is a schematic drawing illustrating an exemplary integrated circuit including an input/output (I/O) interface.

The conventional I/O circuit has various I/O devices, e.g., 1.8-V I/O devices and 3.3-V I/O devices. The conventional I/O circuit can level-shift an input voltage signal swinging between 0 V and 0.9 V output from core devices to between 0 V and 3.3 V. Conventionally, the core devices, the 1.8-V I/O devices, and the 3.3-V I/O devices have different gate oxide thicknesses. To form various thicknesses of the gate oxide layers, a number of thin film processes, mask layers, photolithographic process, and/or etch processes are used. The process for forming the gate oxide layers having three different thicknesses is complicated and costly.

To avoid the complicated and expensive fabrication process, a conventional process has been proposed to form the same gate oxide thickness for the 1.8-V I/O devices and the 3.3-V I/O devices. Conventionally, the gate oxide thickness of the 3.3-V I/O devices is reduced and aligned with the gate oxide thickness of the 1.8-V I/O devices such that a desired operation of the I/O circuit can be achieved. It is found that a gate-source voltage drop $V_{GS}$ of about 3.3 V and/or a drain-source voltage drop $V_{DS}$ of about 3.3 V may be applied to the 3.3-V I/O devices. As noted, the 1.8-V I/O devices have a reduced gate oxide thickness. The gate oxide layer of the 1.8-V I/O devices may not sustain the 3.3-V gate-source voltage drop $V_{GS}$. The 1.8-V I/O devices may have a gate oxide integrity issue. Furthermore, the 3.3-V drain-source voltage drop $V_{DS}$ of the 1.8-V I/O devices may enhance a hot carrier injection.

Based on the foregoing, I/O interfaces of integrated circuits are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

Following are descriptions regarding exemplary integrated circuits including an I/O interface and operating methods thereof. For merely the purpose of descriptions, input voltage signals swinging between 0 V and 0.9 V can be level-shifted to between 0 V and 3.3 V. It is noted that voltage levels described below in conjunction with FIG. 1 are merely exemplary. The scope of the invention is not limited thereto.

FIG. 1 is a schematic drawing illustrating an exemplary integrated circuit including an input/output (I/O) interface. In FIG. 1, an integrated circuit 100 can include a decoding circuit 105. The decoding circuit 105 can decode signals output from core devices (not shown), outputting voltage signals $S_1$ and $S_2$. In some embodiments, the voltage signals $S_1$ and $S_2$ can swing between a first voltage level, e.g., about 0 V, and a second voltage level, e.g., about 0.9 V.

The integrated circuit 100 can include at least one level shifter, e.g., level shifters 110a and 110b, coupled with at least one inverter, e.g., inverters 120a and 120b, respectively. The level shifters 110a and 110b can receive the voltage signals $S_1$ and $S_2$, respectively, output from the decoding circuit 105. The level shifter 110a can be coupled between, for example, a power supply voltage VDD1 and a ground voltage VSS. In some embodiments, the power supply voltage VDD1 can be about 3.3 V. The level shifter 110b can be coupled between, for example, a power supply voltage VDD2 and a ground voltage VSS. In some embodiments, the power supply voltage VDD2 can be about 1.8 V.

In some embodiments, the level shifter 110a can receive the voltage signal $S_1$ from the decoding circuit 105, outputting a voltage signal $S_3$ swinging between the first voltage level, e.g., about 0 V, and a third voltage level, e.g., about 3.3 V. The third voltage level, e.g., 3.3 V, is higher than the second voltage level, e.g., 0.9 V.

In some embodiments, the level shifter 110b can receive the voltage signal $S_2$ from the decoding circuit 105, outputting a voltage signal $S_4$ swinging between the first voltage levels, e.g., about 0 V, and a fourth voltage level, e.g., about 1.8 V.

Referring to FIG. 1, the inverter 120a can receive the voltage signal $S_3$ output from the level shifter 110a, outputting a voltage signal $S_5$ swinging between the third voltage level, e.g., about 3.3 V, and the fourth voltage level, e.g., about 1.8 V. The fourth voltage level, e.g., 1.8 V, is higher than the first voltage level, e.g., 0 V, and lower than the third voltage level, e.g., 3.3 V. In some embodiments, the fourth voltage level is higher than the second voltage level, e.g., 0.9 V.

In some embodiments, the inverter 120b can receive the voltage signal $S_4$ output from the level shifter 110b, outputting a voltage signal $S_6$ swinging between the first voltage level, e.g., about 0 V, and the fourth voltage level, e.g., about 1.8 V.

Referring to FIG. 1, the integrated circuit 100 can include an output buffer 130 coupled with the inverters 120a and 120b. The output buffer 130 can be coupled between, for example, the power supply voltage VDD1 and the ground voltage VSS. The output buffer 130 can include a transistor 131 of a first type, e.g., a PMOS transistor, and a transistor 135 of a second type, e.g., NMOS transistor. The transistors 131 and 135 can receive the voltage signals $S_5$ and $S_6$ output from the inverters 120a and 120b, respectively. The voltage signals $S_5$ and $S_6$ output from the inverters 120a and 120b can control the output buffer 130 outputting a voltage signal that can swing between the first voltage level, e.g., 0 V, and the third voltage level, e.g., 3.3 V. The voltage signal output from the output buffer 130 can be coupled to a pad 140. It is noted that the types of the transistors 131 and 135 are merely exemplary. The scope of the invention is not limited thereto.

In embodiments level-shifting the input voltage signal swinging from 0 V and 0.9 V to between 0 V and 3.3 V, the transistor 131 can be formed by a 1.8-V process technique. The source end of the transistor 131 can be coupled with the power supply voltage VDD1, e.g., 3.3 V. As noted, the voltage signals $S_5$ applied to the gate of the transistor 131 can swing between the voltage levels 1.8 V and 3.3 V. It is found that the voltage drop $V_{GS}$ between the gate and the source of the transistor 131 can be no more than the difference of the third voltage level, e.g., 3.3 V, and the fourth voltage level, e.g., 1.8 V. The voltage drop $V_{GS}$ of about 1.8 V or less can desirably reduce the gate dielectric layer integrity issue.

In some embodiments, the transistors 131 and/or 135 can be a P-type high voltage (HV) device and an N-type HV device, respectively. The HV devices can have asymmetric source and drain structures. For example, a drain side of the HV device can have a lightly doped drain (LDD) that can sustain the voltage drop $V_{DS}$ between the drain and the source of the HV device. The asymmetric HV device can desirably reduce the hot carrier injection issue.

Figure 2:
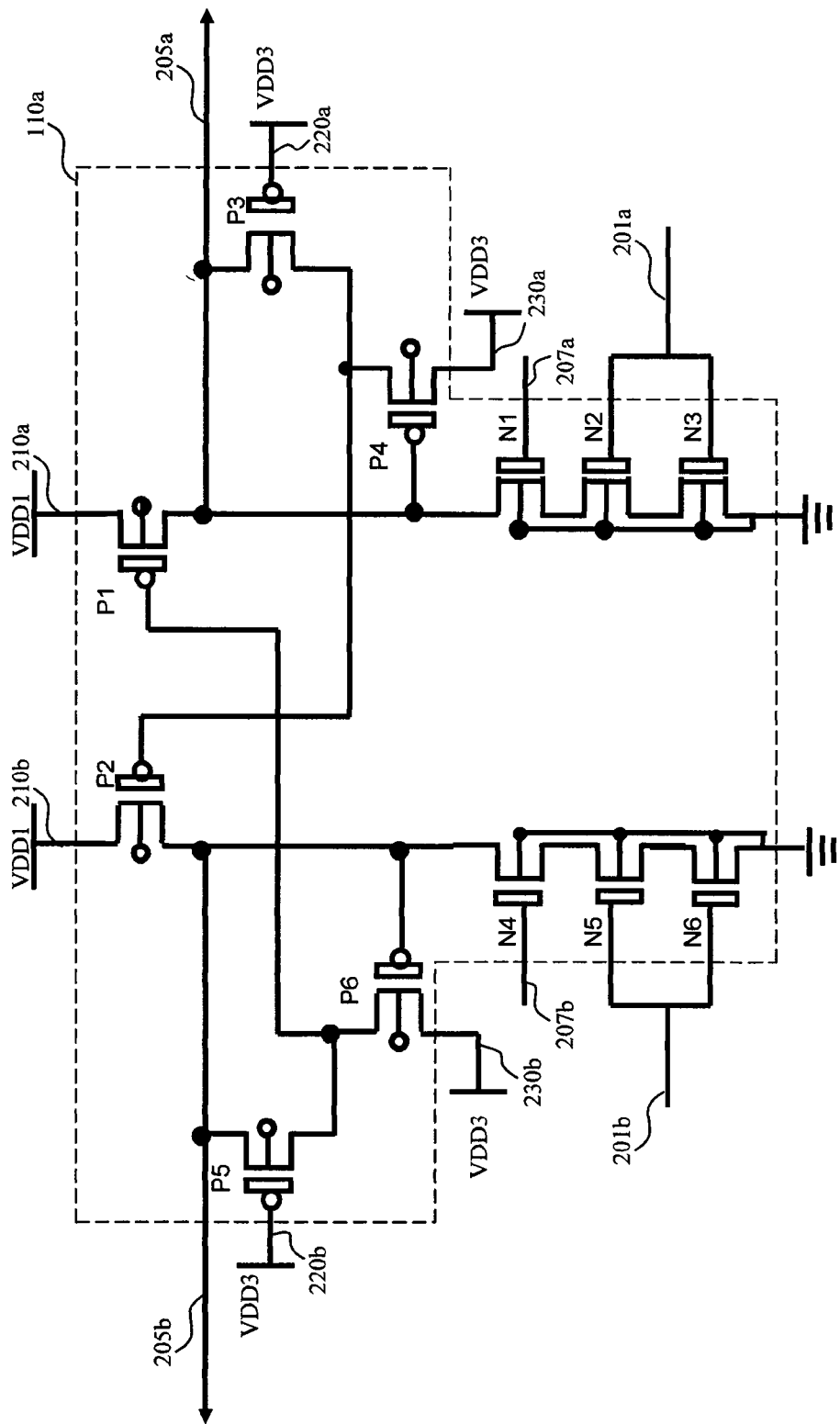
FIG. 2 is a schematic drawing illustrating an exemplary level shifter.

FIG. 2 is a schematic drawing illustrating an exemplary level shifter. In FIG. 2, the level shifter 110a can include at least one input end, e.g., input ends 201a and 201b, and at least one output end, e.g., output ends 205a and 205b. The level shifter 110a can include at least one transistor of the first type, e.g., P-type transistors P1 and P2, between the input ends 201a-201b and the output ends 205a-205b. In some embodiments, the transistors P1 and P2 can be directly or indirectly coupled between the input ends 201a-201b and the output ends 205a-205b. In some other embodiments, the transistors P1 and P2 can be coupled between power supply nodes 210a and 210b and the output nodes 205a and 205b, respectively.

Referring to FIG. 2, the level shifter 110a can include at least one transistor of the second type, e.g., N-type transistors N1-N6. The transistors N1-N3 and N4-N6 can be coupled with the output nodes 205a and 205b, respectively. In some embodiments, the transistors N1 and N4 can be I/O or HV devices. In some other embodiments, the transistors N2 and N5 can be native devices. In still some other embodiments, the transistors N3 and N6 can have a structure similar to the core device.

The level shifter 110a can include at least one transistor of the first type, e.g., P-type transistors P3 and P5. The transistors P3 and P5 can be coupled with the output nodes 205a and 205b, respectively. At least one transistor of the first type, e.g., P-type transistors P4 and P6, can be coupled with the transistors P3 and P5, respectively. Gates of the transistors P4 and P6 can be coupled with the output nodes 205a and 205b, respectively.

Referring again to FIG. 2, the input nodes 201a and 201b of the level shifter 110a can be coupled with the decoding circuit 105 (shown in FIG. 1). The input nodes 201a and 201b can receive complementary voltage signals from the decoding circuit 105. The complementary voltage signals can turn on either the transistors N2-N3 or the transistors N5-N6.

Referring again to FIG. 2, gate nodes 207a and 207b of the transistors N1 and N4, respectively, can receive power-on-control (POC) signals. In some embodiments, the POC signals can turn on or off the transistors N1 and N4 during the operation of the level shifter 110a.

Power supply nodes 220a and 220b can be coupled with the gates of the transistors P3 and P5, respectively. Power supply nodes 230a and 230b can be coupled with the sources of the transistors P4 and P6, respectively. The power supply nodes 220a-220b and 230a-230b can be coupled with a power supply voltage VDD3. In embodiments level-shifting the input voltage signals swinging between 0 V and 0.9 V to between 0 V and 3.3 V, the power supply voltage VDD3 can be about 1.8 V.

Following is a description regarding an exemplary operation of the level shifter 110a. In some embodiments, the complementary voltage signals applied on the input nodes 201a-201b and the POC signals applied on the gate nodes 207a-207b can couple the ground voltage VSS with the output node 205b and isolate the ground voltage VSS from the output node 205a. The grounded output node 205b can turn on the transistor P6. The turned-on transistor P6 can couple the power supply voltage VDD3, e.g., 1.8 V, with the gate of the transistor P1, turning on the transistor P1. The turned-on transistor P1 can couple the power supply voltage VDD1, e.g., 3.3 V, to the output node 205a. The 3.3-V output node 205a can result in the turn-on of the transistor P3. The turned-on transistor P3 can couple the power supply voltage VDD1 to the gate of the transistor P2, turning off the transistor P2.

In other embodiments, the complementary voltage signals applied on the input nodes 201a-201b and the POC signals applied on the gate nodes 207a-207b can couple the ground voltage VSS with the output node 205a and isolate the ground voltage VSS from the output node 205b. The grounded output node 205a can turn on the transistor P4. The turned-on transistor P4 can couple the power supply voltage VDD3, e.g., 1.8 V, to the gate of the transistor P2, turning on the transistor P2. The turned-on transistor P2 can couple the power supply voltage VDD1, e.g., 3.3 V, to the output node 205b. The 3.3-V output node 205b can result in the turn-on of the transistor P5. The turned-on transistor P5 can couple the power supply voltage VDD1 to the gate of the transistor P1, turning off the transistor P1.

It is found that the gates of the transistors P1 and P2 can receive complementary voltage signals that can swing between the voltage levels about 1.8 V and about 3.3 V. Due to the voltage swing, the voltage drop $V_{GS}$ between the gate and the source of each of the transistors P1-P6 can be no more than about 1.8 V. The voltage drop $V_{GS}$ of about 1.8 V or less can desirably reduce the gate dielectric layer integrity issue. In some embodiments, each of the transistors P1, P2, N1, and N4 can be a high voltage (HV) device. The HV device can have asymmetric source and drain structures. For example, a drain side of the HV device can have a lightly doped drain (LDD) that can sustain the voltage drop $V_{DS}$ between the drain and the source of the HV device. The asymmetric HV device can desirably reduce the hot carrier injection issue.

Figure 3:
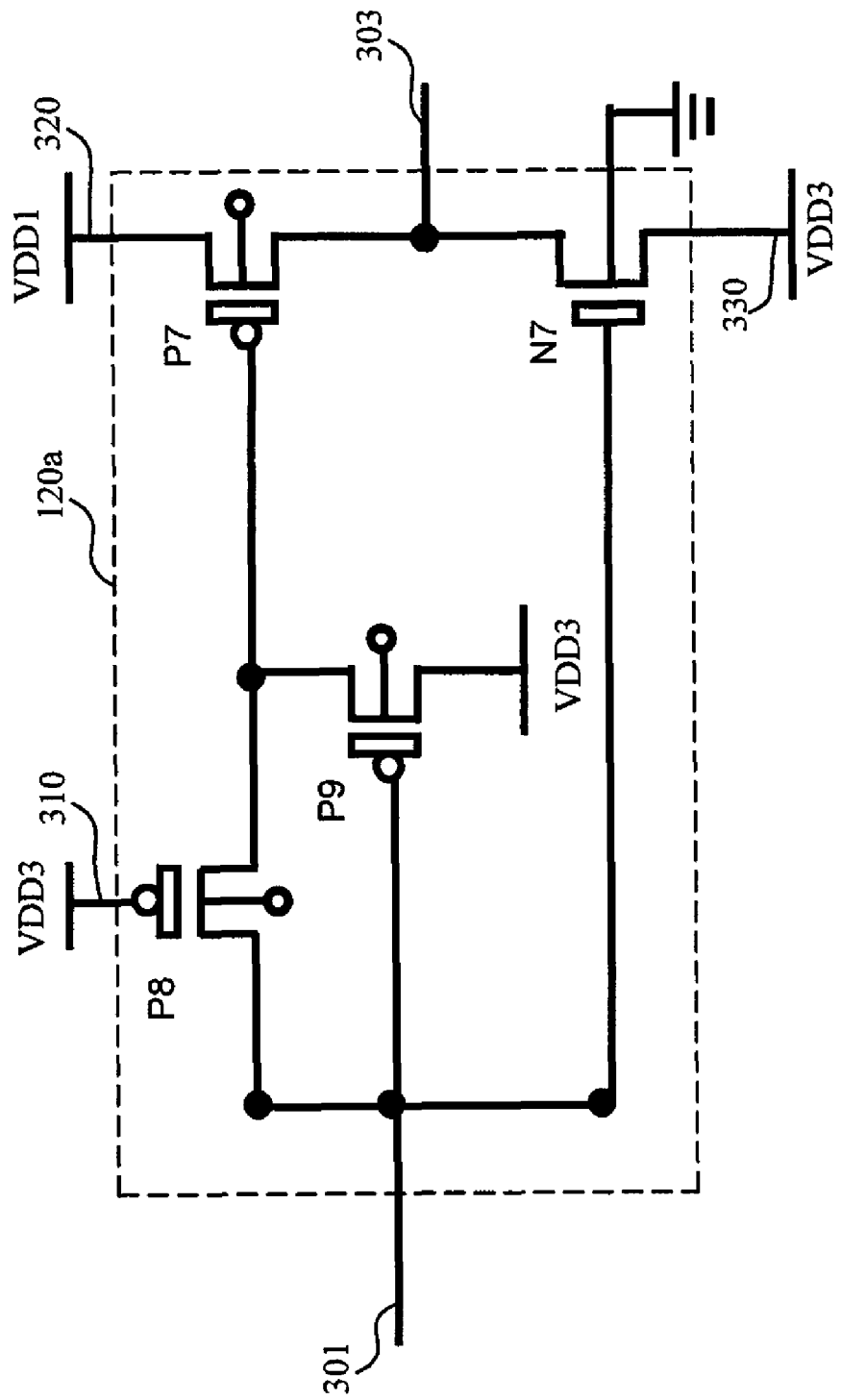
FIG. 3 is a schematic drawing illustrating an exemplary inverter.

FIG. 3 is a schematic drawing illustrating an exemplary inverter. In FIG. 3, the inverter 120a can include an input node 301 and an output node 303. The input node 301 can be coupled with the level shifter 110a (shown in FIG. 1). The output node 303 can be coupled with the output buffer 130 (shown in FIG. 1).

The inverter 120a can include at least one transistor of the first type, e.g., P-type transistor P7, coupled between a power supply node 320 and an output node 303 of the inverter 120a. The power supply node 320 can be coupled with the power supply voltage VDD1, e.g., 3.3 V. At least one transistor of the second type, e.g., N-type transistor N7, can be coupled between an input node 301 of the inverter 120a and the output node 303 of the inverter 120a. The transistor N7 can be coupled with a power supply node 330 that can be coupled with the power supply voltage VDD3, e.g., 1.8 V.

Referring to FIG. 3, the inverter 120a can include a transistor of the first type, e.g., P-type transistor P8. The transistor P8 can be coupled between the gate of the transistor P7 and the input node 301 of the inverter 120a. The gate of the transistor P8 can be coupled with a power supply 310 that can be coupled with the power supply voltage VDD3, e.g., 1.8 V.

The inverter 120a can include at least one transistor of the first type, e.g., P-type transistor P9. The transistor P9 can be coupled with the transistor P8. The gate of the transistor P9 can be coupled with the input node of the inverter 120a. The transistor P9 can be coupled with the power supply voltage VDD3, e.g., 1.8 V.

In embodiments receiving a 3.3-V voltage signal at the input node 301, the 3.3-V voltage signal can result in the turn-on of the transistor P8. The turned-on transistor P8 can couple the 3.3-V voltage signal to the gate of the transistor P7, turning off the transistor P7. The 3.3-V voltage signal can also turn off the transistor P9 and turn on the transistor N7. The turned-on transistor N7 can couple the power supply voltage VDD3 with the output node 303. The output node 303 can output the voltage signal having the power supply voltage VDD3.

In other embodiments receiving a 0-V voltage signal at the input node 301, the 0-V voltage signal turn on the transistor P9 and turn off the transistor N7. The turned-on transistor P9 can couple the power supply voltage VDD3 with the gate of the transistor P7, turning on the transistor P7. The turned-on transistor P7 can couple the power supply voltage VDD1 with the output node 303. The output node 303 can output the voltage signal having the power supply voltage VDD1.

It is found that the gates of the transistor P7 can receive a voltage signal that swings between about 1.8 V and about 3.3 V. Due to the voltage swing, the voltage drop $V_{GS}$ between the gate and the source of the transistor P7 can be no more than about 1.8 V. The voltage drop $V_{GS}$ of about 1.8 V or less can desirably reduce the gate dielectric layer integrity issue. In some embodiments, the transistor N7 can be a high voltage (HV) device. The HV devices can have asymmetric source and drain structures. For example, a drain side of the HV device can have a lightly doped drain (LDD) that can sustain the voltage drop $V_{DS}$ between the drain and the source of the HV device. The asymmetric HV device can desirably reduce the hot carrier injection issue.

Figure 4:
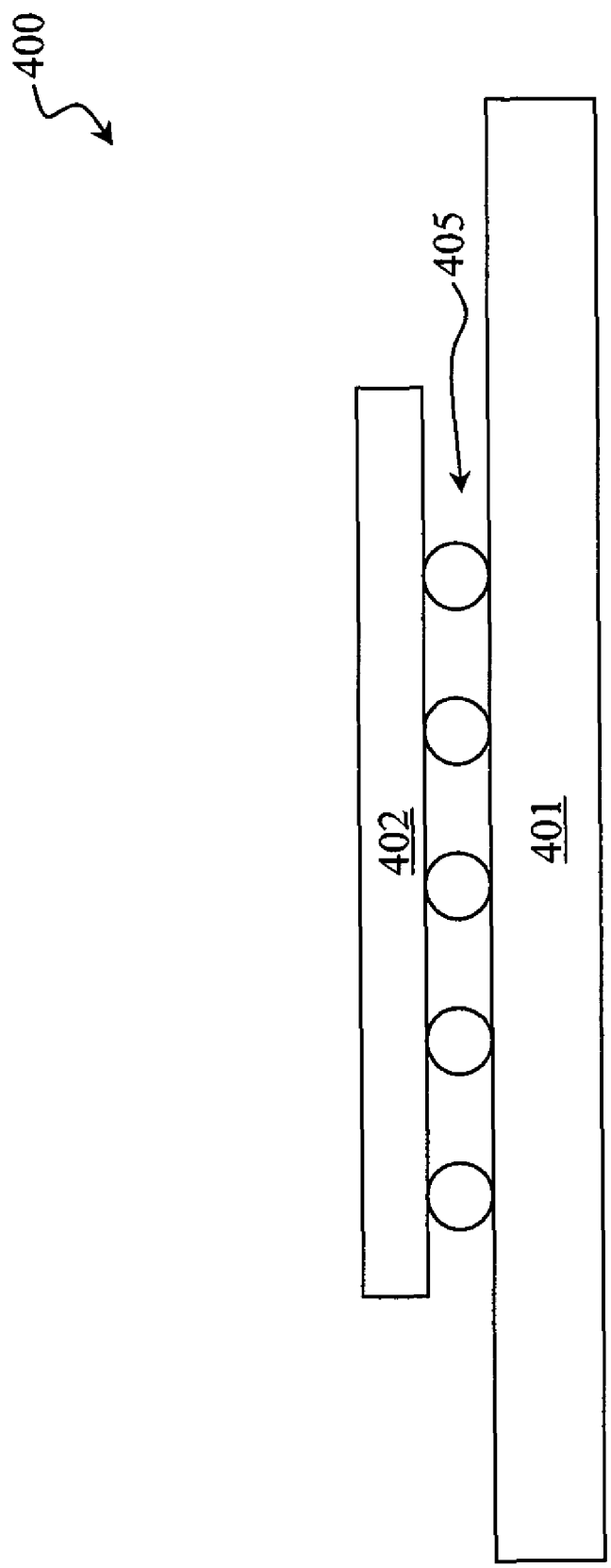
FIG. 4 is a schematic drawing illustrating a system including an exemplary integrated circuit disposed over a substrate board.

FIG. 4 is a schematic drawing illustrating a system including an exemplary integrated circuit disposed over a substrate board. In FIG. 4, a system 400 can include an integrated circuit 402 disposed over a substrate board 401. The substrate board 401 can include a printed circuit board (PCB), a printed wiring board and/or other carrier that is capable of carrying an integrated circuit. The integrated circuit 402 can be similar to the integrated circuit 100 described above in conjunction with FIG. 1, respectively. The integrated circuit 402 can be electrically coupled with the substrate board 401. In some embodiments, the integrated circuit 402 can be electrically coupled with the substrate board 401 through bumps 405. In some other embodiments, the integrated circuit 402 can be electrically coupled with the substrate board 401 through wire bonding. The system 400 can be part of an electronic system such as computers, wireless communication devices, computer-related peripherals, entertainment devices, or the like.

In some embodiments, the system 400 including the integrated circuit 402 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a level shifter configured to receive a first voltage signal that swings between a first voltage level and a second voltage level and output a second voltage signal that swings between the first voltage level and a third voltage level, wherein the third voltage level is higher than the second voltage level; and
    an inverter coupled with the level shifter, the inverter being configured to receive the second voltage signal and output a third voltage signal that swings between the third voltage level and a fourth voltage level, wherein the fourth voltage level is lower than the third voltage level and higher than the first voltage level,
    wherein the level shifter comprises a first transistor of a first type coupled between a first power supply node and an output node of the level shifter, the first power supply node is coupled with the third voltage level, and a gate of the first transistor of the first type is configured to receive a fourth voltage signal that swings between the third voltage level and the fourth voltage level.

2. The integrated circuit of claim 1, wherein the first transistor of the first type is a first high voltage (HV) device.

3. The integrated circuit of claim 1, wherein a voltage drop between a source and a gate of the first transistor of the first type is no more than a difference between the third voltage level and the fourth voltage level.

4. The integrated circuit of claim 1, wherein the level shifter further comprises:
a second transistor of the first type coupled with the output node of the level shifter; and
a third transistor of the first type coupled with the second transistor of the first type, wherein a gate of the third transistor of the first type is coupled with the output node of the level shifter.

5. The integrated circuit of claim 4, wherein the level shifter further comprises at least one first transistor of a second type coupled with the output node of the level shifter and the at least one first transistor of the second type includes a second high voltage (HV) device.

6. The integrated circuit of claim 1, wherein the inverter comprises a fourth transistor of the first type coupled between a second power supply node and an output node of the inverter, the second power supply node is coupled with the third voltage level, and a gate of the fourth transistor of the first type is configured to receive a fifth voltage signal that swings between the third voltage level and the fourth voltage level.

7. The integrated circuit of claim 6, wherein a voltage drop between a source and a gate of the fourth transistor of the first type is no more than a difference between the third voltage level and the fourth voltage level.

8. The integrated circuit of claim 6, wherein the inverter further comprises:
a fifth transistor of the first type coupled between an input node of the inverter and the output node of the inverter; and
a sixth transistor of the first type coupled with the fifth transistor of the first type, wherein a gate of the sixth transistor of the first type is coupled with the input node of the level shifter.

9. The integrated circuit of claim 8, wherein the inverter further comprises at least one second transistor of the second type coupled with the output node of the inverter.

10. An integrated circuit comprising:
a level shifter comprising:
a first transistor of a first type coupled between a first power supply node and a first output node of the level shifter;
at least one first transistor of a second type coupled with the first output node of the level shifter;
a second transistor of the first type having a source and a drain, one of the source and the drain of the second transistor of the first type coupled with the first output node of the level shifter; and
a third transistor of the first type having a direct electrical connection with the other one of the source and the drain of the second transistor of the first type, wherein a gate of the third transistor of the first type is coupled with the first output node of the level shifter; and
an inverter coupled with the level shifter.

11. The integrated circuit of claim 10, wherein the first transistor of the first type is a first HV device and the at least one first transistor of a second type includes a second HV device.

12. The integrated circuit of claim 10, wherein the inverter comprises:
a fourth transistor of the first type coupled between a second power supply node and an output node of the inverter;
a fifth transistor of the first type coupled between an input node of the inverter and a gate of the fourth transistor of the first type;
a sixth transistor of the first type coupled with the fifth transistor of the first type, wherein a gate of the sixth transistor of the first type is coupled with the input node of the inverter; and
at least one second transistor of the second type coupled with the output node of the inverter.

13. The integrated circuit of claim 10, wherein the level shifter further comprises:
a seventh transistor of the first type coupled between a third power supply node and a second output node of the level shifter;
at least one third transistor of the second type coupled with the second output node of the level shifter;
an eighth transistor of the first type coupled with the second output node of the level shifter; and
a ninth transistor of the first type coupled with the eighth transistor of the first type, wherein a gate of the ninth transistor of the first type is coupled with the second output node of the level shifter.

14. A level shifter comprising:
at least one input node configured to receive a first voltage signal that swings between a first voltage level and a second voltage level;
at least one output node configured to output a second voltage signal corresponding to the first voltage signal, the second voltage signal swinging between the first voltage level and a third voltage level, wherein the third voltage level is higher than the second voltage level; and
at least one first transistor of a first type coupled between the at least one input node and the at least one output node, wherein a gate of the at least one first transistor of the first type is capable of receiving a third voltage signal that swings between the third voltage level and a fourth voltage level and the fourth voltage level is higher than the first voltage level and lower than the third voltage level.

15. The level shifter of claim 14, wherein the at least one first transistor of the first type includes a first high voltage (HV) device.

16. The level shifter of claim 14, wherein a voltage drop between a source and a gate of the at least one first transistor of the first type is no more than a difference between the third voltage level and the fourth voltage level.

17. The level shifter of claim 14 further comprises:
at least one first transistor of a second type coupled with the at least one output node of the level shifter;
at least one second transistor of the first type coupled with the at least one output node of the level shifter; and
at least one third transistor of the first type coupled with the at least one second transistor of the first type, wherein a gate of the at least one third transistor of the first type is coupled with the at least one output node of the level shifter.

18. The level shifter of claim 17, wherein the least one first transistor of the second type includes a second high voltage (HV) device.

19. The integrated circuit of claim 10, wherein the third transistor of the first type has a source and a drain, one of the source and the drain of the third transistor of the first type is connected with the other one of the source and the drain of the second transistor of the first type.

* * * * *